(12) United States Patent
Ko

(10) Patent No.: US 8,014,225 B2
(45) Date of Patent: Sep. 6, 2011

(54) CIRCUIT FOR VOLTAGE PUMP AND A SEMICONDUCTOR MEMORY APPARATUS USING THE SAME

(75) Inventor: Young Jo Ko, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 37 days.

(21) Appl. No.: 12/476,512

(22) Filed: Jun. 2, 2009

(65) Prior Publication Data

US 2010/0165777 A1     Jul. 1, 2010

(30) Foreign Application Priority Data

Dec. 30, 2008  (KR) ................... 10-2008-0136387

(51) Int. Cl.
 *G11C 5/14*  (2006.01)
(52) U.S. Cl. ...................................... 365/226; 327/536
(58) Field of Classification Search ............... 365/226; 327/536
 See application file for complete search history.

(56) References Cited

U.S. PATENT DOCUMENTS

| 6,230,280 | B1  | 5/2001 | Okasaka |
| 6,281,742 | B1* | 8/2001 | Sung ............................. 327/535 |
| 7,009,881 | B2* | 3/2006 | Noguchi ................... 365/185.17 |
| 2002/0008566 | A1* | 1/2002 | Taito et al. ..................... 327/536 |
| 2002/0130701 | A1* | 9/2002 | Kleveland ..................... 327/536 |
| 2009/0073795 | A1* | 3/2009 | Pyeon ........................... 365/228 |

FOREIGN PATENT DOCUMENTS

| KR | 100172333 B1 | 10/1998 |
| KR | 1020010030299 A | 4/2001 |
| KR | 100813550 B1 | 3/2008 |

* cited by examiner

*Primary Examiner* — Hoai V Ho
*Assistant Examiner* — Anthan T. Tran
(74) *Attorney, Agent, or Firm* — IP & T Group LLP

(57) ABSTRACT

A voltage pump circuit includes a pumping unit configured to include a plurality of pumps and perform voltage pumping and a pumping control unit configured to generate control signals for selectively driving the pumps in response to a mode determination signal.

9 Claims, 4 Drawing Sheets

142

144

US 8,014,225 B2

CIRCUIT FOR VOLTAGE PUMP AND A SEMICONDUCTOR MEMORY APPARATUS USING THE SAME

CROSS-REFERENCES TO RELATED PATENT APPLICATION

The present application claims priority under 35 U.S.C 119(a) to Korean Application No. 10-2008-0136387, filed on Dec. 30, 2008, in the Korean Intellectual Property Office, which is incorporated herein by reference in its entirety as set forth in full.

BACKGROUND

1. Technical Field

The embodiment described herein relates to a semiconductor memory apparatus and, more particularly, to a voltage pump circuit and a semiconductor memory apparatus using the same.

2. Related Art

After a semiconductor memory chip is fabricated on a wafer, it is checked whether or not the corresponding chip is usable through a test. At this time, when a failure occurs in a memory cell array due to variables during a process, impurities, etc., a redundancy cell is added to the memory chip in order to substitute another cell for the cell that has failed.

However, when excessive failures occur in the cell array, the cell that has failed cannot be substituted by the redundancy cell, thus, the corresponding chip is discarded.

In this case, usable memory cells in the discarded chip are also discarded, such that resources are wasted. Therefore, recently, the usable memory cells are packaged to be used with a capacity smaller than an existing designed capacity, for example, half density.

FIG. 1 is a configuration diagram of a conventional memory chip.

When the capacity of the memory chip is, for example, 2 Gb, the memory chip has a first memory block 20 of 1 GB above the center of the chip and a second memory block 30 of 1 GB below the center of the chip. In addition, the first and second memory blocks 20 and 30 are divided into first and second right memory matrixes 22, 34, 'M_R' and first and second left memory matrixes 24, 32, 'M_L', respectively.

In the memory chip, for example, it is assumed that excessive defective cells exist in the first and second right memory matrixes 22 and 34. Even in this case, since the first and second left memory matrixes 24 and 32 are usable, the corresponding memory chip may be shipped by being packaged into a 1 GB memory chip.

Meanwhile, a voltage pump circuit that supplies a high voltage to a circuit in the memory chip exists in a semiconductor memory chip for an operation to require a voltage higher than an external supply voltage.

FIG. 2 is a configuration diagram of a conventional voltage pump circuit.

As shown in the figure, the voltage pump circuit 40 can include a voltage detection unit 42 that determines a level of a pumping voltage 'VPP' and outputs a pumping enable signal 'PUMP_EN', and an oscillation unit 44 that outputs an oscillation signal 'OSC' when the pumping enable signal 'PUMP_EN' is enabled. Further, the voltage pump circuit 40 can include a sequential generation unit 46 that outputs a driving signal 'OSCx' (x is a natural number in the range of 1 to n) in accordance with the output signal of the oscillation unit 44 and a pumping unit 48 including a plurality of pumps that are sequentially driven in accordance with the driving signal 'OSCx' outputted from the sequential generating unit 46 to output the pumping voltage 'VPP' by boosting an external supply voltage 'VDD'.

As such, the pumping unit 48 includes the plurality of pumps and the number of pumps is determined in accordance with the capacity of the memory chip. Accordingly, in the case of the memory chip initially designed to have 2 GB, the pumping unit 48 may include, for example, 12 pumps.

However, when the memory chip designed to have 2 GB is packaged with the half density and shipped as 1 GB, many pumps that are not suitable to operate a 1 GB memory chip operate.

That is, the pumps are unnecessarily driven, such that current consumption of the memory apparatus increases.

SUMMARY

A voltage pump circuit that can optimize a driving performance of a pumping unit in a semiconductor memory apparatus having a half-density structure is disclosed herein.

In addition, a semiconductor memory apparatus that can minimize the amount of current consumed to generate a pumping voltage in a semiconductor memory apparatus having a half-density structure is disclosed herein.

In one aspect, a voltage pump circuit includes a pumping unit configured to include a plurality of pumps and perform voltage pumping and a pumping control unit configured to generate control signals for selectively driving the pumps in response to mode selection signals.

In another aspect, a semiconductor memory apparatus configured to be operated in a capacity smaller than a designed capacity in response to mode selection signals includes a sequential generation unit configured to generate driving signals of plural bits in response to a pumping enable signal enabled in accordance with a level of a pumping voltage, a pumping control unit configured to generate pump off signals in response to the mode selection signals and a driving signal of at least 1 bit among the driving signals of plural bits, and a pumping unit configured to output the pumping voltage in response to the driving signals and the pump off signals.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
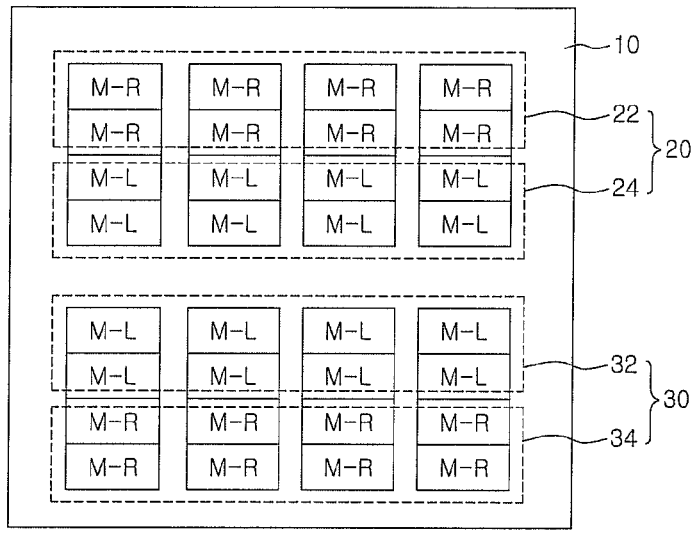
FIG. 1 is a configuration diagram of a conventional memory chip.
Figure 2:
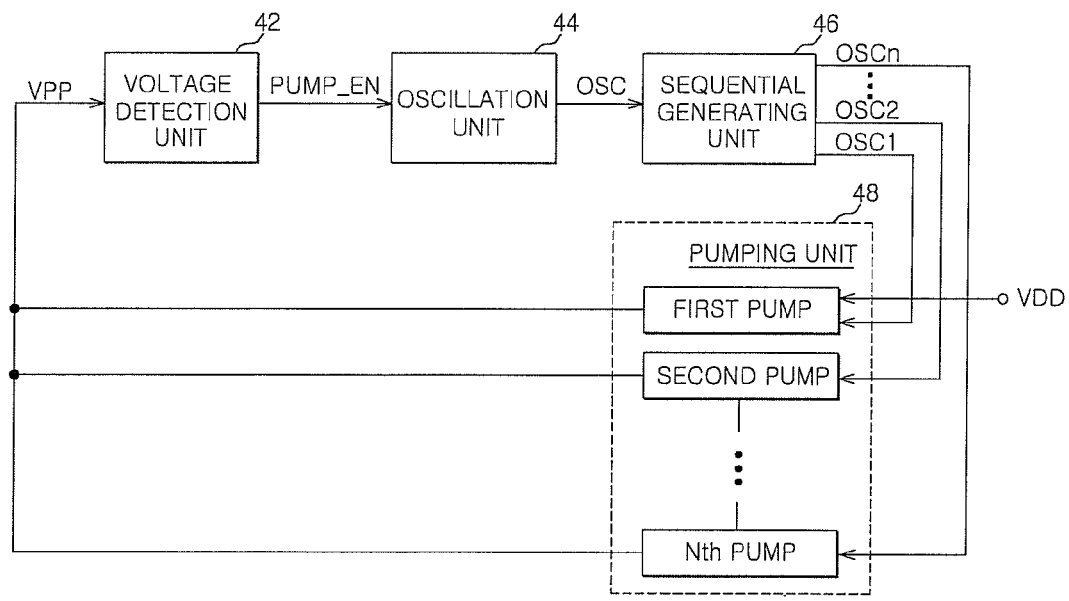
FIG. 2 is a configuration diagram of a conventional voltage pump circuit.
Figure 3:
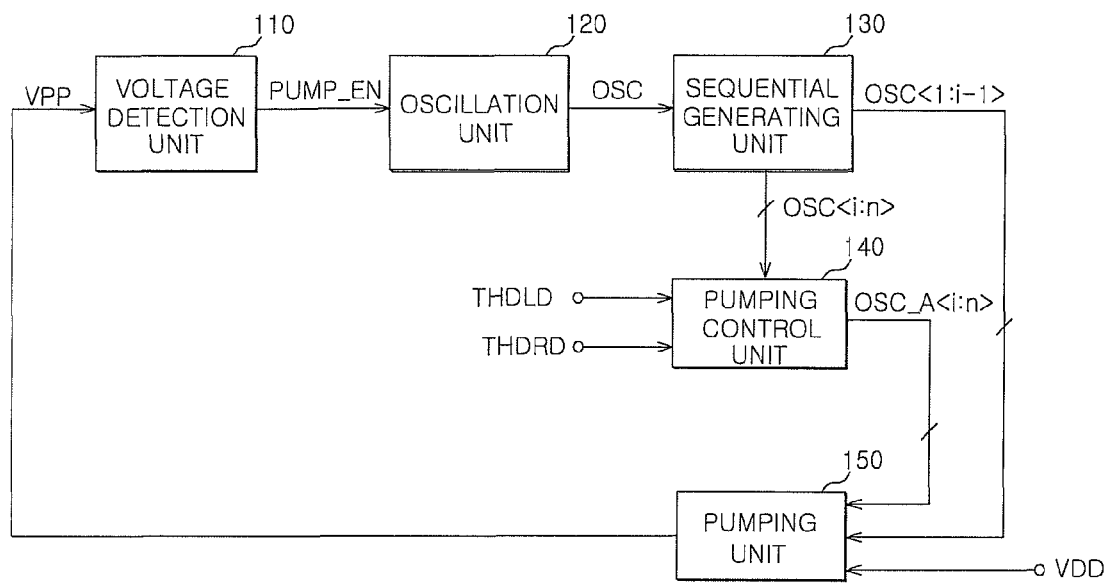
FIG. 3 is a schematic block diagram of an exemplary voltage pump circuit according to one embodiment.

FIG. 3 is a schematic block diagram of an exemplary voltage pump circuit according to one embodiment.

As shown in the figure, the voltage pump circuit 100 according to one embodiment can include a sequential generating unit 130 that generates a driving signal 'OSC<1:n>' of plural bits by sequentially enabling an oscillation signal 'OSC' generated in accordance with a pumping enable signal 'PUMP_EN' and provides a driving signal of at least 1 bit 'OSC<1:i−1>' to a pumping unit 150. Further, the voltage pump circuit 100 can be configured to include a pumping control unit 140 that receives the driving signal of at least 1 bit 'OSC<i:n>' among output signals of the sequential generation unit 130 to generate pump off signals 'OSC_A<i:n>' and provide the pump off signals 'OSC_A<i:n>' to the pumping unit 150.

More specifically, a voltage detection unit 110 can output the pumping enable signal 'PUMP_EN' by determining a level of a pumping voltage VPP and an oscillation unit 120 can output an oscillation signal 'OSC' when the pumping enable signal 'PUMP_EN' is enabled. Moreover, the sequential generation unit 130 can output the driving signal of plural bits 'OSC<1:n>' in accordance with the output signal of the oscillation unit 120.

The pumping control unit 140 can receive i to n-th driving signals 'OSC<i:n>' among the driving signals of plural bits 'OSC<1:n>' and output the pump off signals 'OSC_A<i:n>' in response to a first mode selection signal 'THDLD' and a second mode selection signal 'THDRD'.

Meanwhile, first to i−1-th driving signals 'OSC<1:i−1>' among the driving signals of plural bits 'OSC<1:n>' outputted from the sequential generation unit 130 and the pump off signals 'OSC_A<i:n>' outputted from the pumping control unit 140 are inputted into the pumping unit 150.

The pumping unit 150 includes a plurality of, that is, n number of pumps and can output the pumping voltage 'VPP' by boosting an external supply voltage 'VDD'. At this time, when the driving signals 'OSC<1:i−1>' are enabled, i−1 pumps are sequentially driven, such that a boosting operation is performed, while n−(i−1) pumps are turned off in accordance with the pump off signals 'OSC_A<i:n>'.

For example, a case in which a semiconductor memory chip designed to have a capacity smaller than an initially designed capacity, i.e., 2 GB is shipped to have a half-density structure of 1 GB will be described below.

The pumping unit 150 provided in the memory chip of 2 GB may include, for example, 12 pumps. However, when the memory chip operates with 1 GB, the boosting operation can be performed by using only 8 pumps, such that 4 pumps need not to be operated.

Accordingly, 8 pumps can be configured to be sequentially driven by driving signals 'OSC<1:8>' and the other 4 pumps can be configured not to be driven by pump off signals 'OSC_A<9:12>'.

Figure 4:
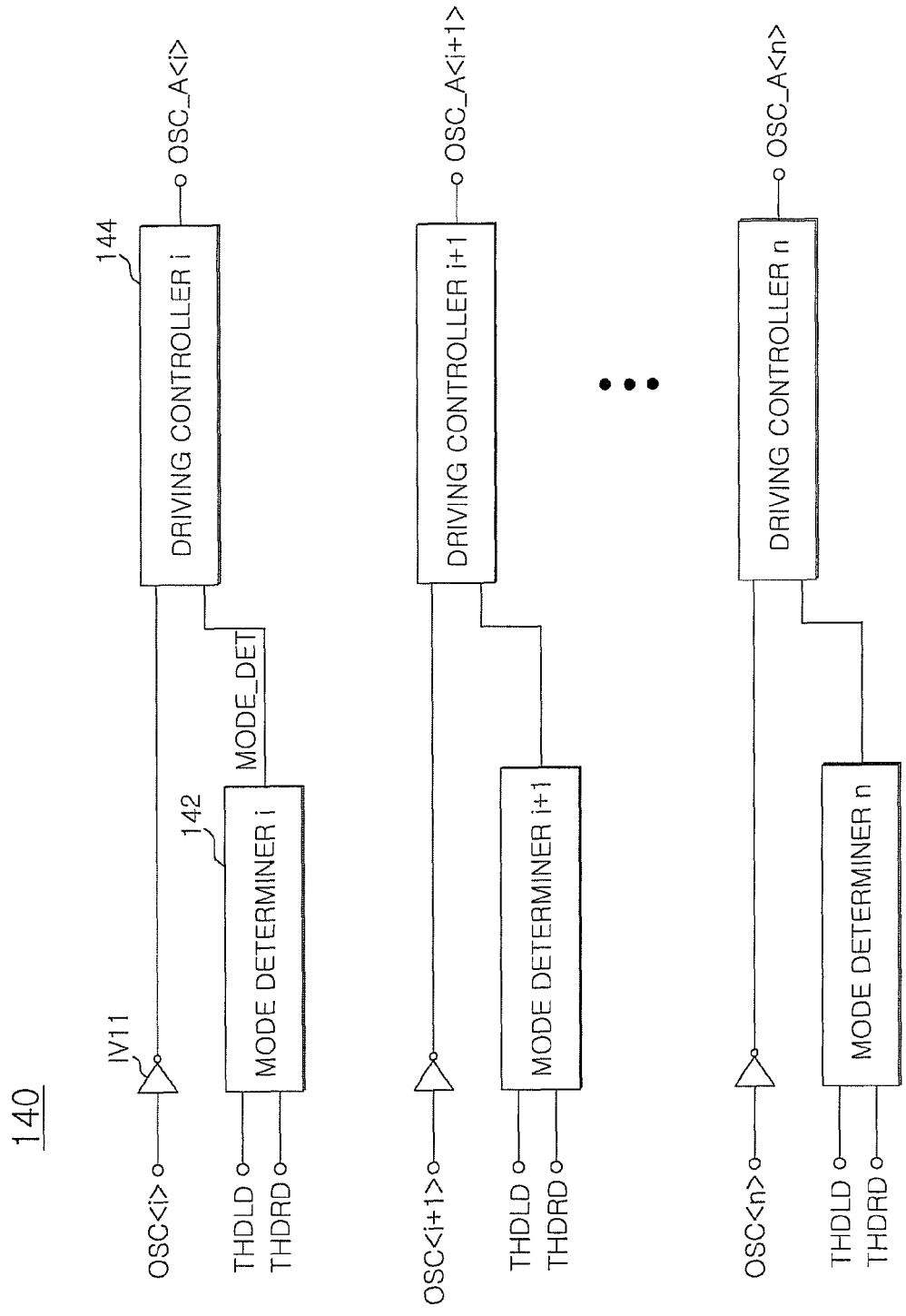
FIG. 4 is a configuration diagram of an exemplary pumping control unit shown in FIG. 3 according to one embodiment.

FIG. 4 is a configuration diagram of an exemplary pumping control unit shown in FIG. 3 according to one embodiment.

As shown in the figure, the pumping control unit 140 can be configured to include inverters 'IV11' that can receive driving signals 'OSC<i:n>' of m bits (m=n−(i−1)), a plurality of mode determiner 142 that can output mode determination signals 'MODE_DET' in response to the first mode selection signal 'THDLD' and the second mode selection signal 'THDRD', a plurality of driving controller 144 that can generate the pump off signal 'OSC_A<i:n>' in response to the output signals of the inverters 'IV11' and the mode determination signals 'MODE_DET' and provide the pump off signals 'OSC_A<i:n>' to the pumping unit 150.

Herein, the first mode selection signal 'THDLD' is outputted at a high logic level in a half-density structure using only a right memory matrix of the memory chip and the second mode selection signal 'THDRD' is outputted at the high logic level in a half-density structure using only a left memory matrix of the memory chip.

If the voltage pump circuit 100 does not have the half-density structure, both the first and second mode selection signals 'THDLD' and 'THDRD' are at a low logic level.

In the present invention, in order to optimize the number of pumps driven in the half-density structure, when the corresponding memory chip is operated in the half-density structure, the mode determination signal 'MODE_DET' is outputted at the high logic level regardless of using the right memory matrix or the left memory matrix.

Further, the driving signals 'OSC<i:n>' outputted from the sequential generation unit 130 are inverted to the low logic level through the inverters 'IV11'.

As a result, the driving controller 144 receives the output signals of the inverters 'IV11' and the mode determination signal 'MODE_DET' and the driving signals 'OSC<i:n>' are outputted from the sequential generation unit 130, such that the pumping operation is required. When the corresponding memory chip is at a half-density mode, the pump off signals 'OSC_A<i:n>' for disabling pumps driven in accordance with the corresponding driving signals 'OSC<i:n>' are outputted.

Figure 5:
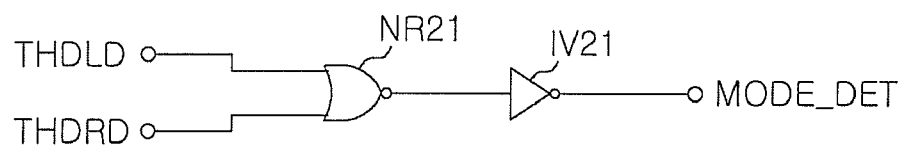
FIG. 5 is a diagram of an exemplary mode determiner shown in FIG. 4 according to one embodiment.

FIG. 5 is a diagram of an exemplary mode determiner shown in FIG. 4 according to one embodiment.

As shown in the figure, the mode determiner 142 can be configured to include a first logic gate 'NR21' that can receive the first mode selection signal 'THDLD' and the second mode selection signal 'THDRD' and an inverter 'IV21' that can output the mode determination signal 'MODE_DET' by inverting an output signal of the first logic gate 'NR21'.

Moreover, it is preferable that the first logic gate 'NR21' is constituted by a NOR gate.

Figure 6:
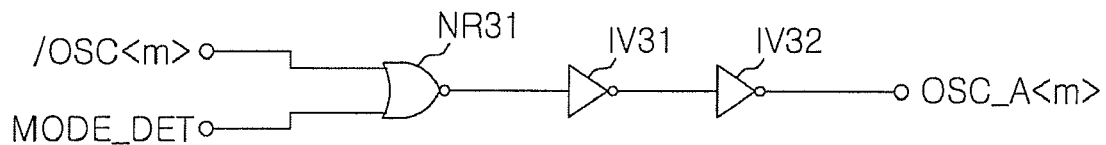
FIG. 6 is a diagram of an exemplary driving controller shown in FIG. 4 according to one embodiment.

FIG. 6 is a diagram of an exemplary driving controller shown in FIG. 4 according to one embodiment.

In FIG. 6, the driving controller 144 adopted in the present invention can be configured to include a second logic gate 'NR31' that can receive an m-th driving signal 'OSC<m>' in the range of i to n and the mode determination signal 'MODE_DET'. Herein, it is preferable that the second logic gate 'NR31' is constituted by the NOR gate.

In addition, the driving controller 144 may further include a series of even-number inverters 'IV31' and 'IV32' that is connected to an output terminal of the second logic gate 'NR31' and outputs a pump off signal 'OSC_A<m>' for an m-th pump.

Therefore, in the case when an inversion signal of the driving signal 'OSC<m>' is at the low logic level, that is, the driving signal 'OSC<m>' is enabled, such that the voltage pump circuit performs the pumping operation, the driving controller 144 enables the pump off signal 'OSC<m>' so as not to drive the corresponding m-th pump when the mode determination signal 'MODE_DET' is at the high logic level, that is, the corresponding semiconductor chip is operated at the half-density mode.

As a result, since the boosting voltage is generated by operating only pumps of optimized numbers in the half-density structure, it is possible to prevent unnecessary current consumption.

In the semiconductor memory apparatus having the half-density structure, many unnecessary pumps for generating the pumping voltage exist in comparison with the initially designed capacity of the semiconductor memory apparatus.

Further, when the semiconductor memory apparatus generates the pumping voltage, excessively many pumps are driven, such that a current is wasted.

Accordingly, when the pumping voltage is generated by driving only pumps suitable for the half-density structure among a plurality of pumps by using the pumping control unit of the present invention, it is possible to more efficiently operate the semiconductor memory apparatus by preventing unnecessary current consumption.

While certain embodiments have been described above, it will be understood that the embodiments described are by way of example only. Accordingly, the apparatus and the method described herein should not be limited based on the described embodiments. Rather, the devices and methods described herein should only be limited in light of the claims that follow when taken in conjunction with the above description and accompanying drawings.

What is claimed is:

1. A voltage pump circuit, comprising:
   a pumping unit including a plurality of pumps and configured to pump a voltage; and
   a pumping control unit configured to, in response to mode selection signals, generate control signals to select between driving some but not all of the plurality of pumps and driving all of the plurality of pumps
   wherein the pumping control unit is configured to output a mode determination signal in response to a first mode selection signal for using a first memory matrix and a second mode selection signal for using a second memory matrix,
   wherein the pumping control unit includes:
      a plurality of first inverters configured to each receive a respective one of driving signals;
      at least one mode determiner configured to output the mode determination signal in response to the first mode selection signal and the second mode selection signal; and
      a plurality of driving controllers configured to output pump off signals to said some but not all of the plurality of pumps respectively in response to output signals of the first inverters and the mode determination signal.

2. The voltage pump circuit of claim 1, further comprising:
   a sequential generation unit configured to generate driving signals by sequentially enabling oscillation signals generated in response to a pumping enable signal and provide at least one of the driving signals to the pumping unit,
   wherein the pumping control unit is configured to output the pump off signals to said some but not all of the plurality of pumps in response to at least another one of the driving signals and in response to the mode selection signals.

3. The voltage pump circuit of claim 1 wherein the at least one mode determiner includes a first logic gate configured to receive the first mode selection signal and the second mode selection signal.

4. The voltage pump circuit of claim 1 wherein each of the driving controllers includes a second logic gate that receives a respective one of the output signals of the plurality of first inverters and receives the mode determination signal.

5. The voltage pump circuit of claim 2, further comprising:
   a voltage detection unit configured to output the pumping enable signal by determining a voltage level of the pumped voltage; and
   an oscillation unit configured to output the oscillation signals in response to the pumping enable signal,
   wherein the plurality of pumps are further configured to be driven in accordance with said at least another one of the driving signals outputted from the sequential generation unit and the pump off signals outputted from the pumping control unit.

6. A semiconductor memory apparatus configured to be operated in a capacity smaller than a designed capacity in response to mode selection signals, the apparatus comprising:
   a sequential generation unit configured to generate driving signals in response to a pumping enable signal enabled in accordance with a voltage level of a pumped voltage;
   a pumping control unit configured to generate pump off signals in response to the mode selection signals and at least one of the driving signals; and
   a pumping unit including a plurality of pumps and configured to output the pumped voltage in response to at least another one of the driving signals and the pump off signals, wherein the pumping control unit is further configured to select between driving some but not all of the plurality of pumps and driving all of the plurality of pumps,
   wherein the pumping control unit is configured to output a mode determination signal in response to a first mode selection signal for using a first memory matrix of the semiconductor memory apparatus and a second mode selection signal for using a second memory matrix of the semiconductor memory apparatus,
   wherein the pumping control unit includes:
      a plurality of first inverters each configured to receive a respective one of the driving signals;
      at least one mode determiner configured to output the mode determination signal in response to the first mode selection signal and the second mode selection signal; and
      a plurality of driving controllers configured to output the pump off signals to said some but not all of the plurality of pumps in response to output signals of the first inverters and the mode determination signal.

7. The semiconductor memory apparatus of claim 6, wherein the at least one mode determiner includes a first logic gate configured to receive the first mode selection signal and the second mode selection signal.

8. The semiconductor memory apparatus of claim 6, wherein each of the driving controllers includes a second logic gate that receives a respective one of the output signals of the plurality of first inverters and the mode determination signal.

9. The semiconductor memory apparatus of claim 6, further comprising:
   a voltage detection unit configured to output the pumping enable signal by determining a voltage level of the pumped voltage; and
   an oscillation unit configured to output an oscillation signal in response to the pumping enable signal,
   wherein the plurality of pumps are configured to be driven in accordance with said at least another one of the driving signals outputted from the sequential generating unit and the pump off signals outputted from the pumping control unit.

* * * * *